(12) United States Patent
Chuang

(10) Patent No.: US 12,745,626 B2
(45) Date of Patent: Sep. 22, 2026

(54) SEMICONDUCTOR DEVICE HAVING FUSE COMPONENT

(71) Applicant: NANYA TECHNOLOGY CORPORATION, New Taipei city (TW)

(72) Inventor: Ying-Cheng Chuang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 344 days.

(21) Appl. No.: 18/231,453

(22) Filed: Aug. 8, 2023

(65) Prior Publication Data

US 2025/0054859 A1 Feb. 13, 2025

(51) Int. Cl.
*H10D 64/00* (2025.01)
*H10D 64/27* (2025.01)
*H10W 20/49* (2026.01)

(52) U.S. Cl.
CPC ........ *H10W 20/493* (2026.01); *H10D 64/513* (2025.01)

(58) Field of Classification Search
CPC H01L 23/5256; H10D 64/512; H10D 64/513; H10B 12/34; H10B 12/053; H10B 12/30; H10B 12/02; H10B 12/50
See application file for complete search history.

(56) References Cited

U.S. PATENT DOCUMENTS

2019/0287899 A1* 9/2019 Nagai .................. H10D 64/021

FOREIGN PATENT DOCUMENTS

TW 201822365 A 6/2018
TW 202025453 A 7/2020
TW 202324425 A 6/2023

* cited by examiner

*Primary Examiner* — Reema Patel
(74) *Attorney, Agent, or Firm* — CKC & Partners Co., LLC

(57) ABSTRACT

A semiconductor device includes a substrate, a plurality of gate structures, and a fuse component. The substrate has an active region and a peripheral region surrounding the active region. The gate structures are disposed in the active region of the substrate. The fuse component is disposed at the peripheral region of the substrate. The fuse component has a poly silicon portion having a bottom tip pointing to the substrate, a dielectric film between the substrate and the poly silicon portion, and a conductive portion on the poly silicon portion. A method of forming a semiconductor device is also disclosed.

10 Claims, 9 Drawing Sheets

SEMICONDUCTOR DEVICE HAVING FUSE COMPONENT

BACKGROUND

Field of Invention

The present invention relates to a semiconductor device and a method of forming the same. More particularly, the present invention relates to a semiconductor device having a fuse and a method of forming the same.

Description of Related Art

In recent decades, demand to storage capability has increased as electronic products continue to improve. In order to increase storage capability of a memory device (e.g., a DRAM device), more memory cells are integrated in the memory device. As the integration level increases, fabrication process of the memory device become much more complicated, and process window become rather narrow.

Fuse elements are a widely used feature in integrated circuits for a variety of purposes, such as improving manufacturing yield or customizing a generic integrated circuit. For example, by replacing defective circuits on a chip with duplicate or redundant circuits on the same chip, manufacturing yields can be significantly increased. Additionally, an integrated circuit designed with fuses that can be selectively blown may be economically manufactured and adapted to a variety of custom uses.

SUMMARY

According to an aspect of the disclosure a semiconductor device includes a substrate, a plurality of gate structures, and a fuse component. The substrate has an active region and a peripheral region surrounding the active region. The gate structures are disposed in the active region of the substrate. The fuse component is disposed at the peripheral region of the substrate. The fuse component has a poly silicon portion having a bottom tip pointing to the substrate, a dielectric film between the substrate and the poly silicon portion, and a conductive portion on the poly silicon portion.

In some embodiments, the bottom tip of the poly silicon portion has an angle, and the angle is about 90 degrees.

In some embodiments, the dielectric film has a V-shape cross-section.

In some embodiments, the bottom tip of the poly silicon portion is below a top surface of the substrate.

In some embodiments, a resistance of the conductive portion is lower than a resistance the poly silicon portion.

In some embodiments, the poly silicon portion has a bottom section and a top section, the bottom section is embedded in the substrate, and the top section is protruded from the substrate.

In some embodiments, the gate structures include a dummy gate structure and an active gate structure, and the dummy gate structure is disposed at a boundary of the active region.

In some embodiments, the semiconductor device further includes an insulating layer between the substrate and the gate structures, wherein a thickness of a first portion of the insulating layer between the substrate and the dummy gate structure is thicker than a thickness of a second portion of the insulating layer between the substrate and the active gate structure.

In some embodiments, the semiconductor device further includes a contact component disposed at the peripheral region of the substrate, wherein the contact component has a dielectric film on the substrate, a poly silicon portion on the dielectric film, and a conductive portion on the poly silicon portion.

In some embodiments, a cross-section of the poly silicon portion of the fuse component is different from a cross-section of the poly silicon portion of the contact component.

Another aspect of the disclosure provides a method of forming a semiconductor device. The method includes forming a plurality of gate structures at an active region of a substrate; forming a mask on the substrate, wherein the mask covers the active region and has an opening exposing a portion of the substrate. The method further includes etching the portion of the substrate through the opening of the mask such that a recess is formed at a peripheral region of the substrate, wherein the recess has a bottom corner; and forming a fuse component in the recess.

In some embodiments, etching the portion of the substrate includes using NaOH as etchant.

In some embodiments, etching the portion of the substrate includes using KOH as etchant.

In some embodiments, an angle of the bottom corner of the recess is about 90 degrees.

In some embodiments, the method further includes removing the mask after the recess is formed; and performing an oxidation process to form an oxide layer lining the recess and on the peripheral region of the substrate.

In some embodiments, the method further includes forming a poly silicon layer on the oxide layer; forming a conductive layer on the poly silicon layer; and patterning the oxide layer, the poly silicon layer, and the conductive layer such that the fuse component including a dielectric film on the substrate, a poly silicon portion on the dielectric film, and a conductive portion on the poly silicon portion is formed.

In some embodiments, forming a poly silicon layer on the oxide layer includes filling the recess with the poly silicon layer such that the poly silicon portion of the fuse component has a bottom tip.

In some embodiments, patterning the oxide layer, the poly silicon layer, and the conductive layer includes forming a contact component at the peripheral region of the substrate.

In some embodiments, a resistance of the conductive layer is lower than a resistance the poly silicon layer.

In some embodiments, the dielectric film of the fuse component has a V-shape cross-section.

According to the embodiments of the disclosure, the fuse component has a bottom tip which is benefit to electrical field concentration, and a corona discharge is induced at the bottom tip when an external voltage is applied to the fuse component. Therefore, the breakdown voltage required to blow (fail) the fuse component can be reduced.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
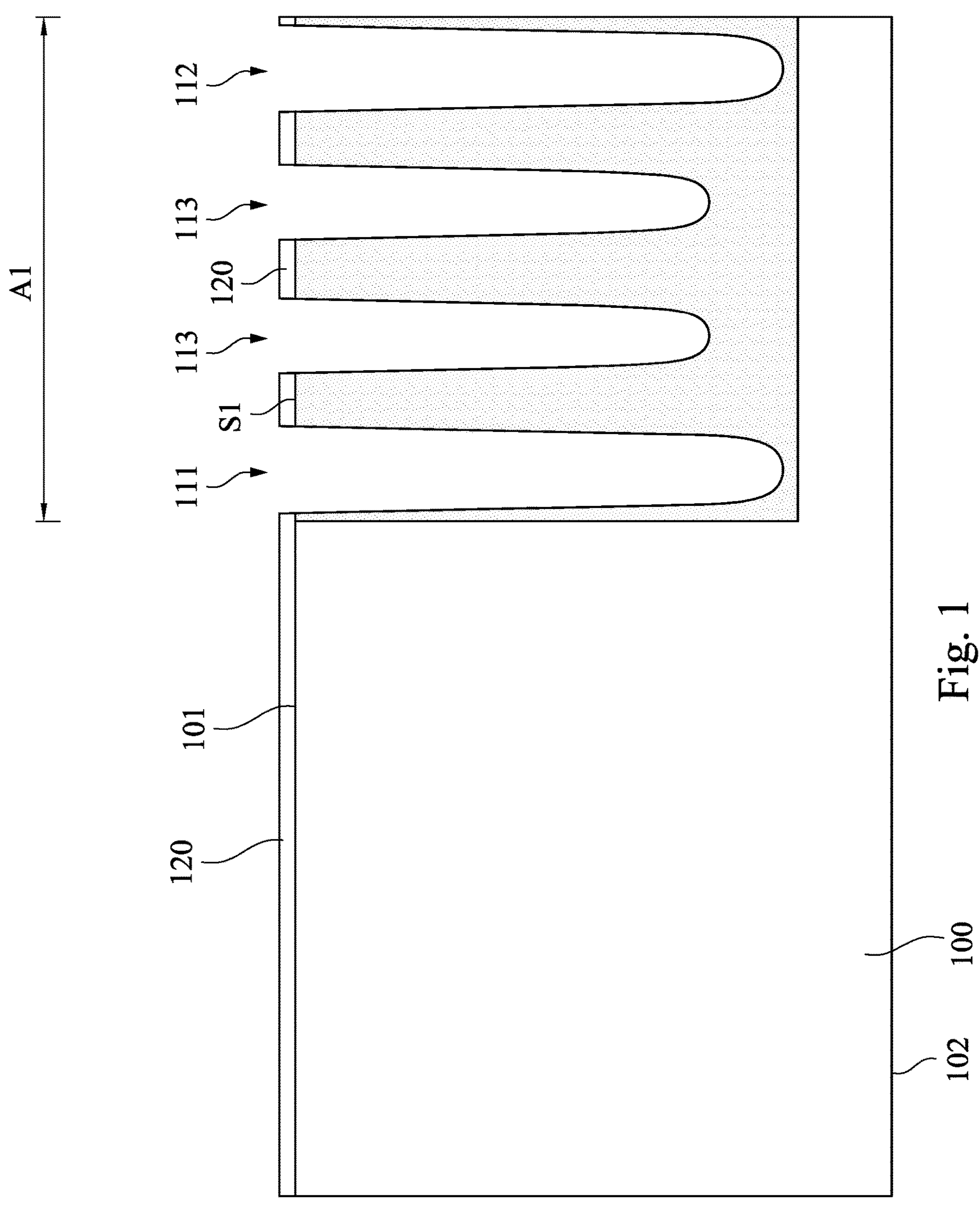
FIG. 1 to FIG. 8 are different steps of forming a semiconductor device according to some embodiments of the disclosure.

Reference will now be made in detail to the present embodiments of the invention, examples of which are illustrated in the accompanying drawings. Wherever possible, the same reference numbers are used in the drawings and the description to refer to the same or like parts.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Fuse elements can be utilized to replace defective circuits on a chip with duplicate or redundant circuits on the same chip or be selectively blown to adapt various custom applications. An electrical fuse (E-fuse) is a fuse component that is disconnected or blown by passing an electrical current. The breakdown voltage of the E-fuse component would decide the electrical current that is required to disconnect or blow the E-fuse component. The disclosure related to a semiconductor device having a fuse with a reduced breakdown voltage and a method of forming the same.

Reference is made to FIG. 1 to FIG. 8, in which FIG. 1 to FIG. 8 are different steps of forming a semiconductor device according to some embodiments of the disclosure. As shown in FIG. 1, in step S10, a plurality of trenches 111, 112, and 113 are formed in an active region A1, in which the active region A1 is defined in a substrate 100. □In some embodiments, the substrate 100 may include a surface 101 and a surface 102 opposite to the surface 101. In some embodiments, the surface 101 may be an active surface of the substrate 100 and the surface 102 may be a backside surface of the substrate 100. In some embodiments, the substrate 100 may be, for example, a silicon (Si) substrate. Alternatively, the substrate 100 can is a Si substrate and is doped with other IV-IV, III-V or II-VI semiconductor materials. In some other embodiments, the substrate 100 may include a layered semiconductor such as silicon/silicon germanium, silicon-on-insulator, or silicon germanium-on-insulator.

In some embodiments, the active region A1 may be disposed over or in the substrate 100. In some embodiments, the active region A1 may be disposed over or proximal to the surface 101 of the substrate 100. In some embodiments, the active region A1 may have a surface S1 exposed from the surface 101 of the substrate 100. In some embodiments, the surface S1 of the active region A1 may be substantially coplanar with the surface 101 of the substrate 100.

In some embodiments, the active region A1 may be doped with an N-type dopant such as phosphorus (P), arsenic (As), or antimony (Sb). In some other embodiments, the doped region A1 may be doped with a P-type dopant such as boron (B) or indium (In). In some embodiments, the substrate 100 may be or include an unimplanted area. In some embodiments, the active region A1 may have a higher doping concentration than the substrate 100.

In some embodiments, the trenches 111 and 112 at the boundary of the active region A1 and the trenches 113 are disposed between trenches 111 and 112. In some embodiments, the depth of the trenches 111 and 112 at the boundary of the active region A1 can be deeper than the depth of the trenches 113. In some embodiments, the bottom of the trenches 111 and 112 can be above the bottom of the active region A1, approximate to the bottom of the active region A1, or below the bottom of the active region A1.

In some embodiments, the formation of the trenches 111, 112 and 113 includes forming a hard mask layer 120 on the surface 101 of the substrate 100. Then a patterned photoresist layer (not shown) is formed on the hard mask layer 120. The patterned photoresist layer is patterned to have openings that expose portions of the hard mask layer 120. An etching process is further performed through the openings of the patterned photoresist layer to remove portions of the hard mask layer 120 and the active region A1 that are not protected by the patterned photoresist layer such that the trenches 111, 112 and 113 are formed in the active region A1. The patterned photoresist layer can be removed after trenches 111, 112 and 113 are formed.

In some embodiments, the hard mask layer 120 can be a single layer structure or a multi-layer structure. For example, the hard mask layer 120 may include a pad oxide layer on the surface 101 of the substrate 100 and a nitride layer on the pad oxide layer. In some embodiments, the thickness of the nitride layer can be greater than the thickness of the pad oxide layer. In some embodiments, the hard mask layer 120 is still remained on the surface 101 of the substrate 100 after the trenches 111, 112, and 113 are formed.

Figure 2:
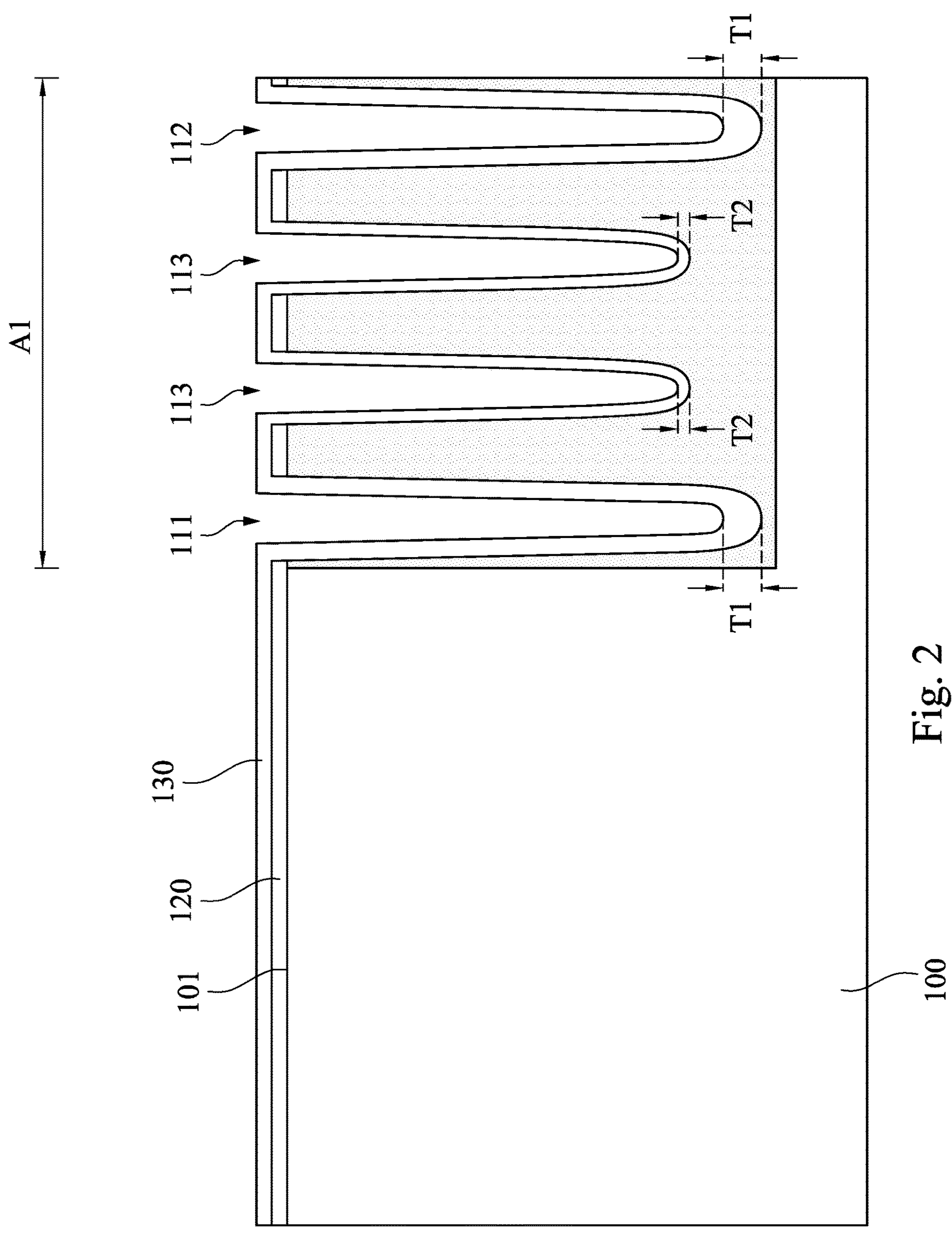

Reference is further made to FIG. 2. In step S12, an insulating layer 130 is formed lining the trenches 111, 112, and 113 and the hard mask layer 120. In some embodiments, the insulating layer 130 is a dielectric layer that may include a silicon oxide ($SiO_2$) or the like. In some other embodiments, the insulating layer 130 may include high-k dielectric materials such as hafnium oxide ($HfO_2$), hafnium silicate ($HfSiO_4$), lanthanum oxide ($La_2O_3$), lanthanum aluminum oxide ($LaAlO_3$), zirconium oxide ($ZrO_2$), zirconium silicate ($ZrSiO_4$), aluminum oxide ($Al_2O_3$), or combinations thereof.

The insulating layer 130 can be formed by any suitable deposition process. In some embodiments, the deposition process is controlled such that the thickness T1 of the insulating layer 130 at the bottom of the trenches 111 and 112 is much thicker than the thickness T2 of the insulating layer 130 at the bottom of the trenches 113.

Figure 3:
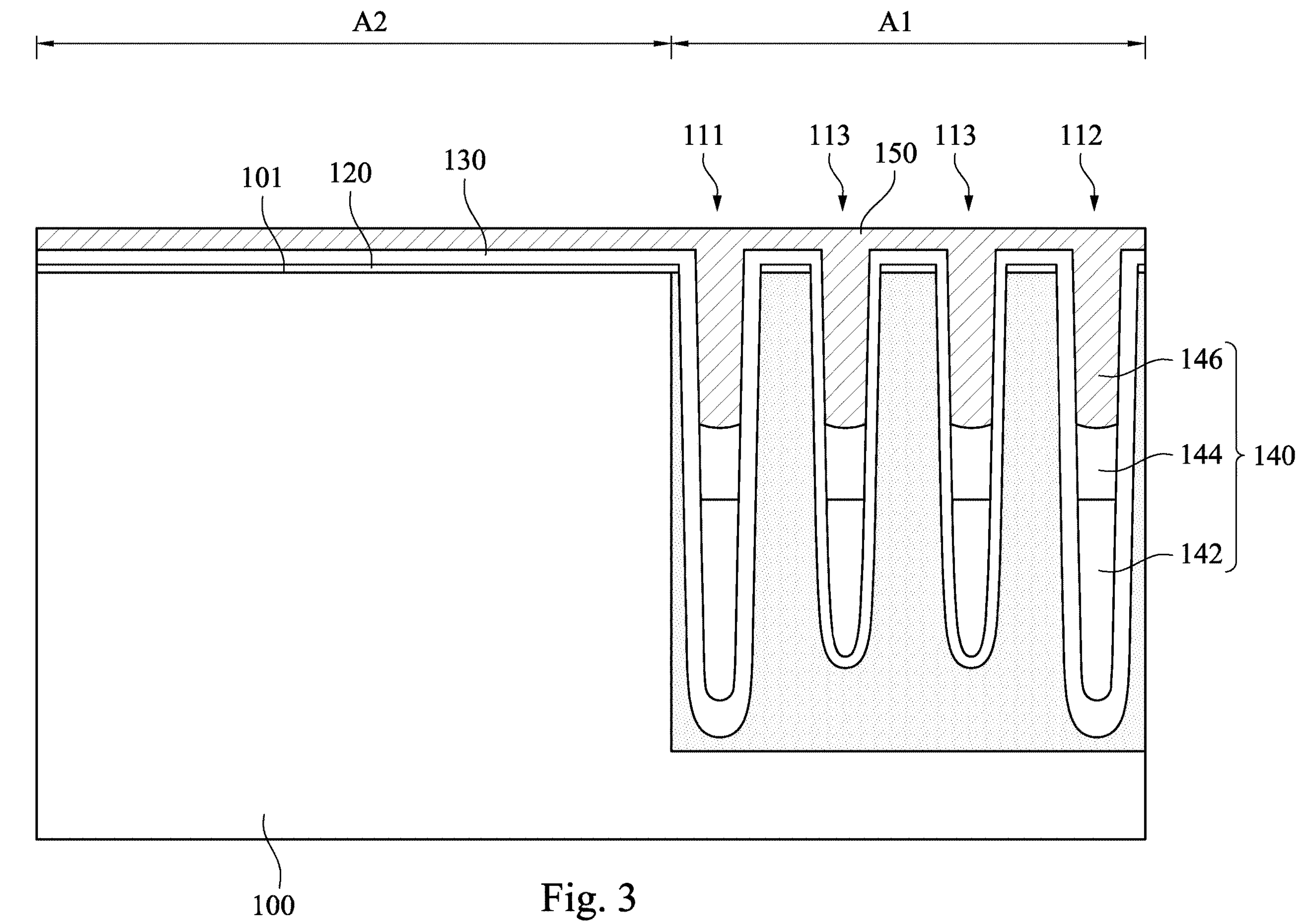

Reference is made to FIG. 3. In step S14, a plurality of gate structures 140 and word lines 150 are formed in the trenches 111, 112, and 113. In some embodiments, the formation of the gate structures 140 includes depositing a bottom conductive layer 142 in the bottom of the trenches 111, 112, and 113, a middle conductive layer 144 on the bottom conductive layer 142, and a top conductive layer 146 on the middle conductive layer 144. In some embodiments, the material of the bottom conductive layer 142 can be metal nitride such as TiN. The material of the bottom conductive layer 142 can be deposited at least partially filling the trenches 111, 112, and 113, and then an etch back process is performed to remove portions of the material of the bottom conductive layer 142 thereby forming the bottom conductive layer 142 at the bottom of the trenches 111, 112, and 113.

Similarly, the material of the middle conductive layer 144 can be deposited on the bottom conductive layer 142 and at least partially filling the trenches 111, 112, and 113, and then an etch back process is performed to remove portions of the material of the middle conductive layer 144 thereby forming the middle conductive layer 144 at the middle of the trenches 111, 112, and 113. In some embodiments, the material of the middle conductive layer 144 can be poly-silicon.

The material of the top conductive layer 146 is then deposited. In some embodiments, the material of the top conductive layer 146 can be metal nitride such as TiN. The material of the top conductive layer 146 not only completely fills the trenches 111, 112, and 113, but also covers the surface 101 of the substrate 100. After the material of the top conductive layer 146 is deposited, a patterning process is performed to remove portions of the material of the top conductive layer 146 on the surface 101 of the substrate 100. More particularly, after the patterning process, portions of the material of the top conductive layer 146 are disposed in the top of the trenches 111, 112, and 113 and on the middle conductive layer 144, and the bottom conductive layer 142, the middle conductive layer 144, and the top conductive layer 146 in the trenches 111, 112, and 113 are together regarded as the gate structures 140. The remaining portions of the material of the top conductive layer 146 on the surface 101 of the substrate 100 can be regarded as the word lines 150 which are linear structures and connected to the corresponding gate structures 140. The insulating layer 130 is disposed between the gate structures 140 and the active region A1 of the substrate 100, and the insulating layer 130 can be also regarded as a gate dielectric layer.

In some embodiments, the gate structures 140 at the boundary of the active region A1 such as the gate structures 140 filled in the trenches 112 and 112 have a thicker insulating layer 130 underneath. Thus the gate structures 140 filled in the trenches 112 and 112 with the thicker insulating layer 130 can be regarded as isolation structures. In some embodiments, the gate structures 140 filled in the trenches 112 and 112 can be regarded as dummy gate structures, and the gate structures 140 filled in the trenches 113 can be regarded as active gate structures.

Figure 4:
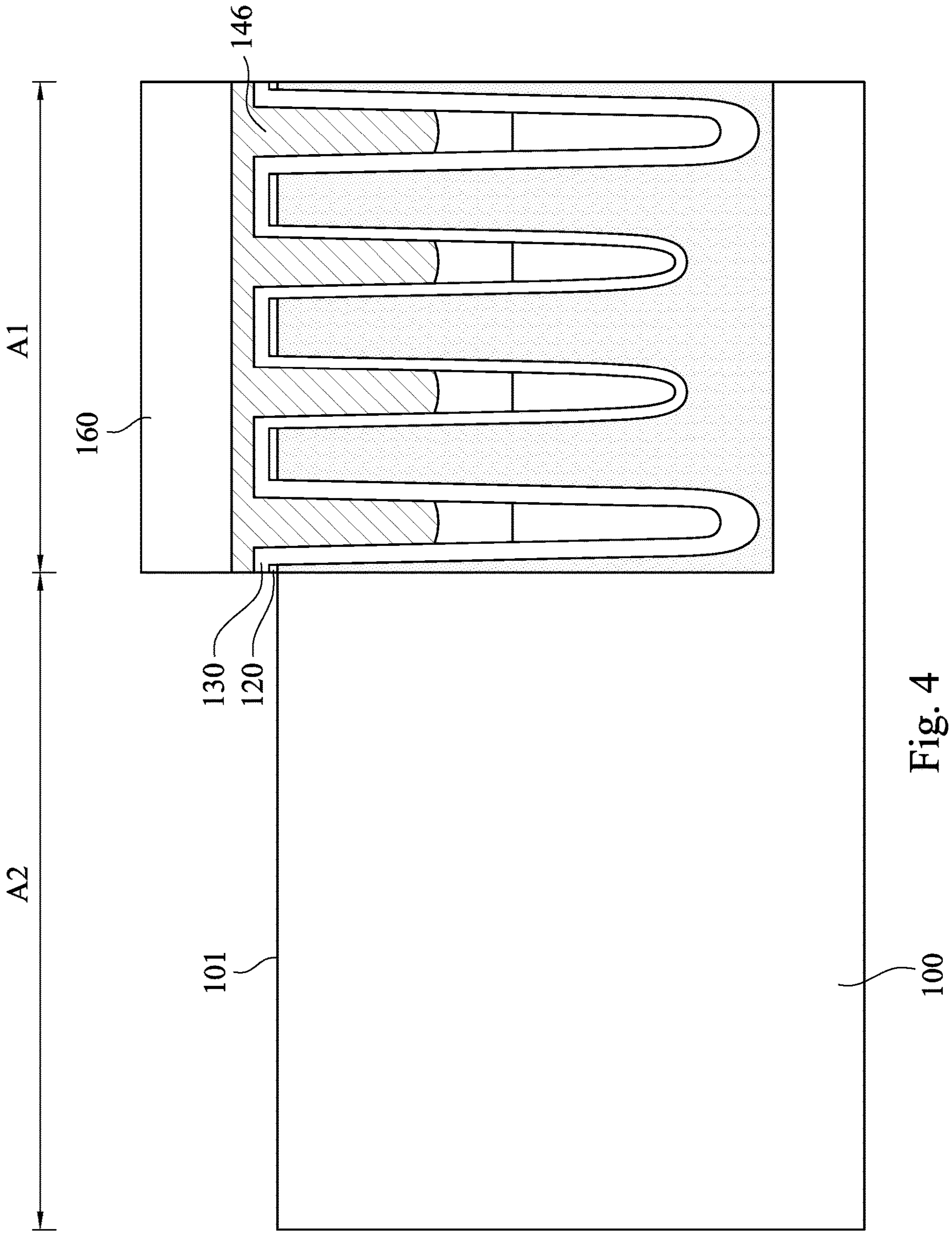

Reference is made to FIG. 4. In step S16, a first mask 160 is formed covering the active region A1 of the substrate 100, and a peripheral region A2 of the substrate 100 is not covered by the first mask 160. In some embodiments, the peripheral region A2 is located at the periphery of the substrate 100, and the active region A1 can be encircled by the peripheral region A2. After the first mask 160 is formed covering the active region A1 of the substrate 100, one or more etching processes are performed to remove the portions of the hard mask layer 120, the insulating layer 130, and the top conductive layer 146 that are not protected by the first mask 160. The surface 101 of the substrate 100 at the peripheral region A2 is revealed and is exposed from the first mask 160 after the one or more etching processes are performed. Then the first mask 160 is removed after the removal of the portions of the hard mask layer 120, the insulating layer 130, and the top conductive layer 146.

Figure 5:
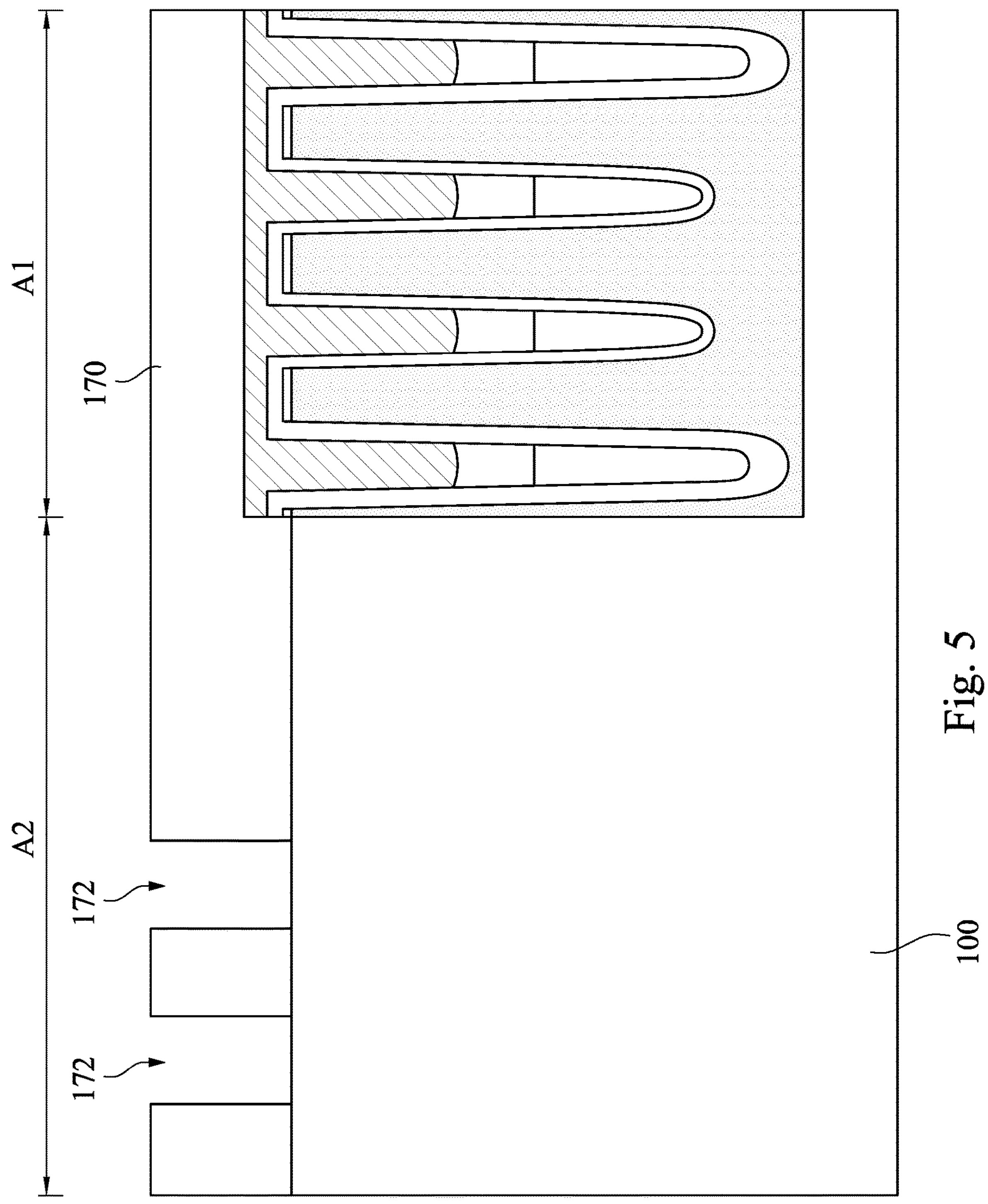

Reference is made to FIG. 5. In step S18, a second mask 170 is formed on the substrate 100. The second mask 170 is formed on both the active region A1 and the peripheral region A2 of the substrate 100. More particularly, the active region A1 of the substrate 100 is entirely protected by the second mask 170, and portions of the peripheral region A2 of the substrate 100 are exposed from the second mask 170. For example, the second mask 170 is a patterned mask and includes a plurality of openings 172 to expose the portions of the peripheral region A2 of the substrate 100. In some embodiments, the material of the second mask 170 can be photoresist.

Figure 6:
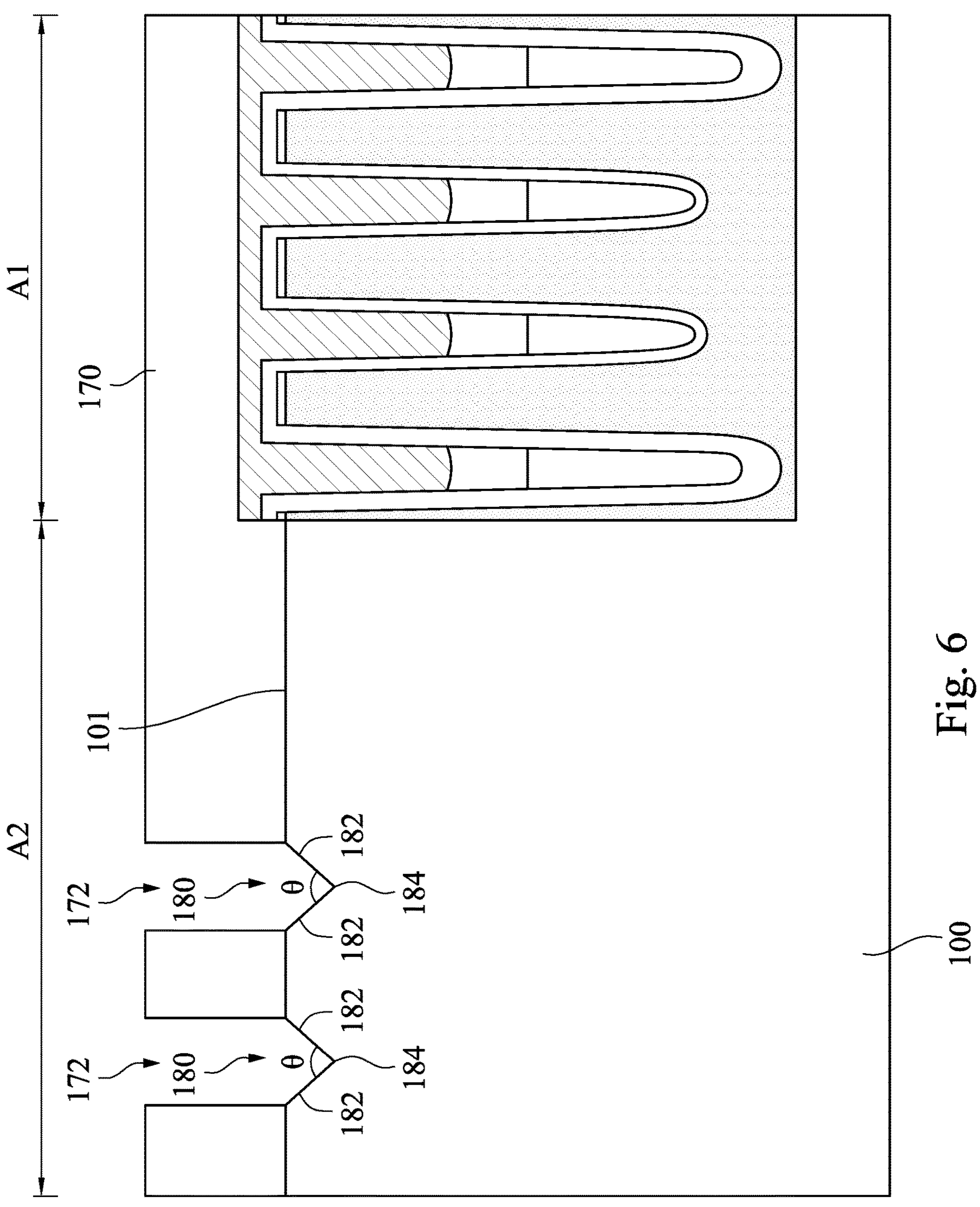

Reference is further made to FIG. 6. In step S20, an etching process is performed through the openings 172 of the second mask 170 to remove portions of the substrate 100 thereby forming a plurality of recesses 180 on the surface 101 of the substrate 100. In some embodiments, the substrate 100 includes a monocrystalline silicon substrate and having a particular crystal lattice orientation, and the etching process is a wet etching process that has a significant fast etching rate to the silicon substrate having the particular crystal lattice orientation, such that the formed recesses 180 have sidewalls 182 and a bottom corner 184 defined by the sidewalls 182.

For example, in some embodiments, the substrate 100 includes a monocrystalline silicon substrate and having a crystal lattice orientation of Si <100>. The wet etching process may use an aqueous NaOH solution as the wet etchant. The wet etching process has sufficient chemical strength to etch the <100> plane with a lower density, but the chemical strength is relatively weak when etching the <111> plane with a higher density. Therefore, the sidewalls 182 of the recesses 180 are continuous <111> planes. Alternatively, in some other embodiments, the substrate 100 includes a monocrystalline silicon substrate and having a crystal lattice orientation of Si <111>, and the wet etching process uses the KOH aqueous solution as the wet etchant for instead.

Due to the etching direction of the wet etching is directly related to the facet of the crystal lattice orientation of the Si substrate 100, the sidewalls 182 of the recesses 180 after being etched are relatively flat and smooth. Additionally, the bottom corner 184 of the recesses 180 has a sharp and vivid profile. In some embodiments, each of the recesses 180 has a V-shape cross-section, and the angle θ of the bottom corner 184 of the recess 180 is about 90 degrees.

After the recesses 180 are formed on the peripheral region A2 of the substrate 100, the second mask 170 can be removed.

Figure 7:
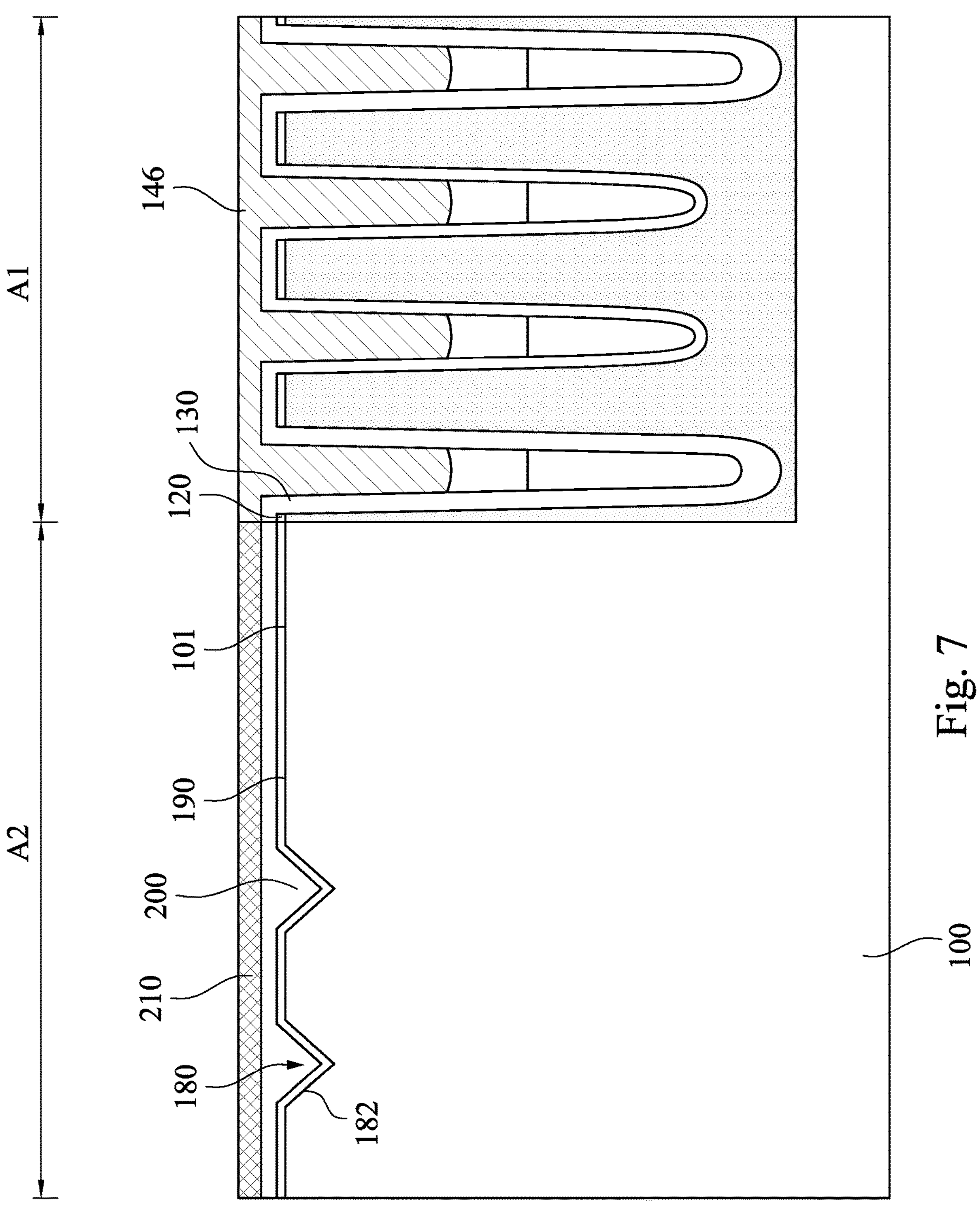

Reference is made to FIG. 7. In step S22, an oxidation process is performed to form an oxide layer 190 on the peripheral region A2 of the substrate 100. More particularly, the oxide layer 190 is formed by transforming silicon material into silicon oxide material at the surface 101 of the peripheral region A2 of the substrate 100. Because the surface roughness of the surface 101 of the substrate 100 and the sidewalls 182 of the recesses 180 is flat and smooth, the growth of the oxide layer 190 can be thin and uniform. In some embodiments, the oxide layer 190 at the peripheral region A2 and the insulating layer 130 at the active region A1 can be bridged by the hard mask layer 120.

After the oxide layer 190 is formed on the surface 101 of the substrate 100 and the sidewalls 182 of the recesses 180, a poly silicon layer 200 is deposited on the oxide layer 190. In some embodiments, the poly silicon layer 200 is deposited to fill the recesses 180. In some embodiments, an etch back process is performed such that the poly silicon layer 200 has a substantially flat top surface.

A conductive layer 210 is then deposited on the poly silicon layer 200. The material of the conductive layer 210 at the peripheral region A2 can be the same or different from the material of the top conductive layer 146 at the active region A1. In some embodiments, the material of the conductive layer 210 at the peripheral region A2 may be low-resistance material such as metal. In some embodiments, the material of the conductive layer 210 can be W.

Optionally, a planarization is performed such that the top surface of the conductive layer 210 at the peripheral region A2 is level with the top surface of the top conductive layer 146 at the active region A1. In some other embodiments, the top surface of the conductive layer 210 at the peripheral region A2 can be above or below the top surface of the top conductive layer 146 at the active region A1.

Figure 8:
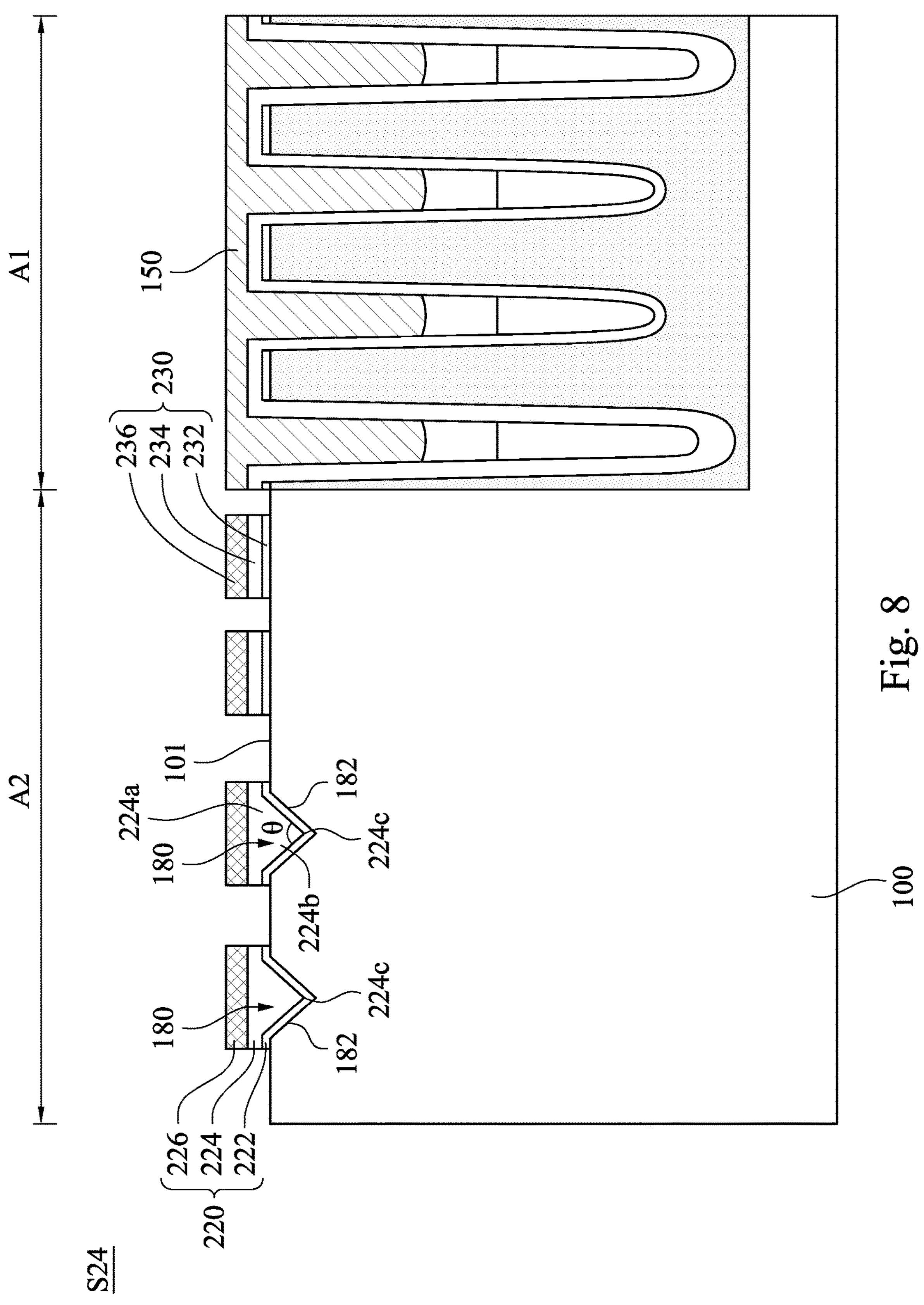

Reference is made to FIG. 8. In step S24, a patterning process is performed to a plurality of fuse components 220 and a plurality of contact components 230 at the peripheral region A2. Namely, the fuse components 220 and the contact components 230 are formed simultaneously, and the cross-section of the fuse components 220 is different from the cross-section of the contact components 230. Each of the fuse components 220 has a dielectric film 222, a poly silicon portion 224 on the dielectric film 222, and a conductive portion 226 on the poly silicon portion 224. Each of the contact components 230 has a dielectric film 232, a poly silicon portion 234 on the dielectric film 232, and a conductive portion 236 on the poly silicon portion 234. The main difference between the cross-section of the fuse components 220 and the cross-section of the contact components 230 is that the poly silicon portion 224 of the fuse component 220 further extends into the substrate 100 and has a bottom tip 224*c* pointing to the bottom of the substrate 100, and the dielectric film 222 of the fuse component 220 is a V-shape. The bottom tip 224*c* of the fuse component 220 is below the surface 101 of the substrate 100. On the other hand, the poly silicon portion 234 of the contact components 230 has a rectangle cross-section and the dielectric film 232 of the contact components 230 lies on the surface 101 of the substrate 100.

In some embodiments, the contact components 230 include gate contacts and are connected to the word lines 150 through the conductive lines and other interconnection structures.

In some embodiments, each of the fuse components 220 is connected to a main circuit, a redundant circuit, or a duplicate circuit on the substrate 100. In some embodiments, the fuse components 220 connected to the defective main circuit can be selectively blown (failed) to electrically conducting the duplicate circuit, for repairing purpose. In some other embodiments, one of the fuse components 220 connected to the main circuit or the redundant circuit is selectively blown (failed), to operate the other one of the main circuit or the redundant circuit, for customizing purpose.

Each of the fuse components 220 has the dielectric film 222 on the recess 180 of the substrate 100, the poly silicon portion 224 on the dielectric film 222, and the conductive portion 226 on the poly silicon portion 224. The dielectric film 222 is conformally formed on the sidewalls 182 of the recess 180, and the resistance of the conductive portion 226 is lower than the resistance of the poly silicon portion 224. The poly silicon portion 224 has a bottom section 224*b* and a top section 224*a*. The bottom section 224*b* of the poly silicon portion 224 is embedded in the substrate 100 and fills the recess 180. The top section 224*a* of the poly silicon portion 224 is disposed on the bottom section 224*b* and protrudes from the surface 101 of the substrate 100. The bottom section 224*b* has the bottom tip 224*c* pointing to the bottom of the substrate 100. The angle θ of the corner is about 90 degrees. The bottom tip 224*c* of the poly silicon portion 224 is benefit to electrical field concentration, and a corona discharge is induced at the bottom tip 224*c* of the poly silicon portion 224 when an external voltage is applied to the fuse component 220. Therefore, the breakdown voltage required to blow (fail) the fuse component 220 can be reduced.

Figure 9:
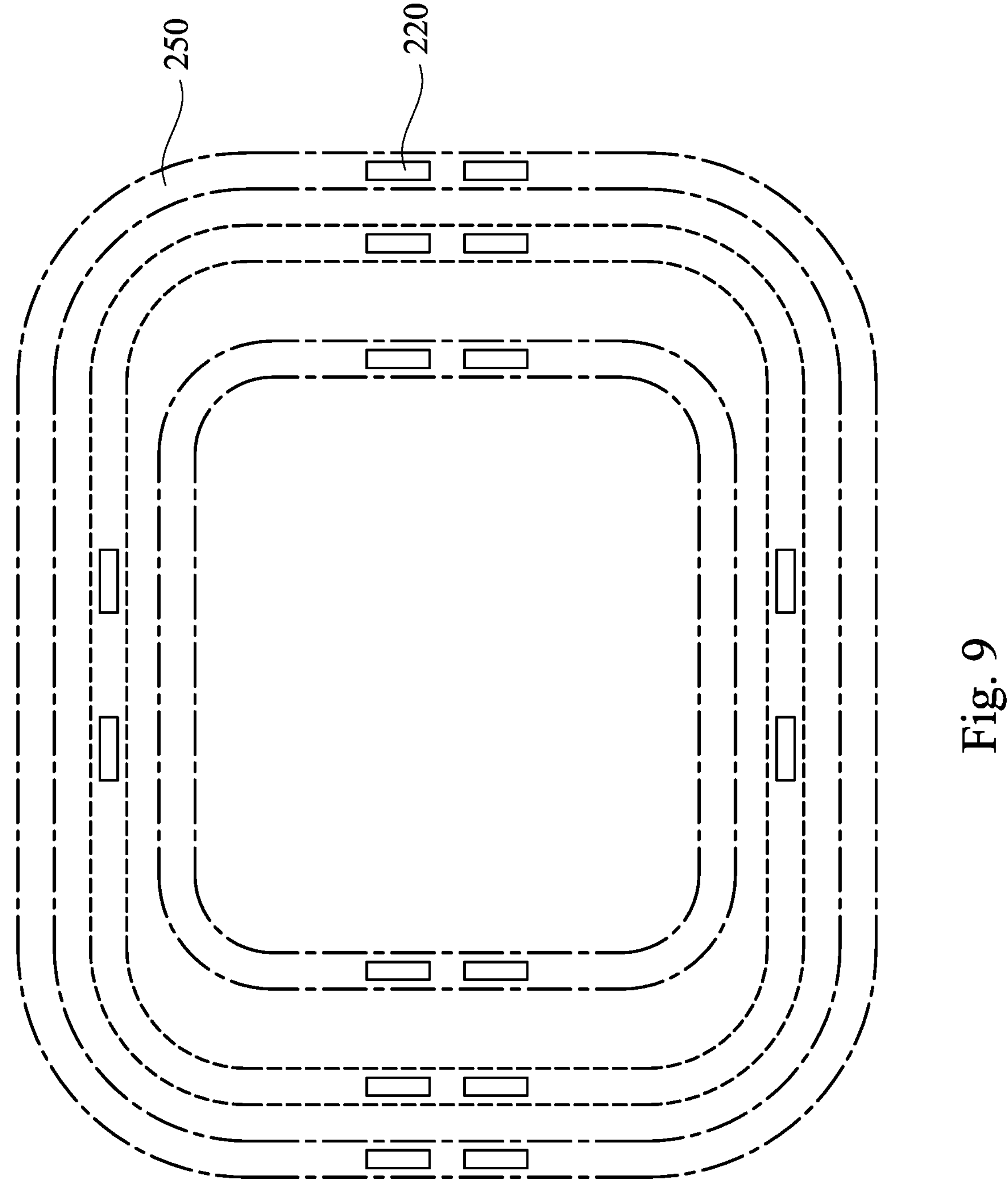
FIG. 9 is a schematic top view illustrating the peripheral region of the semiconductor device, according to some embodiments of the disclosure.

Reference is made to FIG. 9, in which FIG. 9 is a schematic top view illustrating the peripheral region of the semiconductor device, according to some embodiments of the disclosure. The fuse components 220 are electrically connected to the circuits through the conductive lines 250. The conductive lines 250 can be a part of the interconnection structure and at a higher or lower level than the fuse components 220.

According to the embodiments of the disclosure, the fuse component has a bottom tip which is benefit to electrical field concentration, and a corona discharge is induced at the bottom tip when an external voltage is applied to the fuse component. Therefore, the breakdown voltage required to blow (fail) the fuse component can be reduced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:

a substrate having an active region and a peripheral region surrounding the active region;

a plurality of gate structures disposed in the active region of the substrate; and a fuse component disposed at the peripheral region of the substrate, wherein the fuse component has a poly silicon portion having a bottom tip pointing to the substrate, a dielectric film between the substrate and the poly silicon portion, and a conductive portion on the poly silicon portion.

2. The semiconductor device of claim 1, wherein the bottom tip of the poly silicon portion has an angle, and the angle is 90 degrees.

3. The semiconductor device of claim 1, wherein the dielectric film has a V-shape cross-section.

4. The semiconductor device of claim 1, wherein the bottom tip of the poly silicon portion is below a top surface of the substrate.

5. The semiconductor device of claim 1, wherein a resistance of the conductive portion is lower than a resistance the poly silicon portion.

6. The semiconductor device of claim 1, wherein the poly silicon portion has a bottom section and a top section, the bottom section is embedded in the substrate, and the top section is protruded from the substrate.

7. The semiconductor device of claim 1, wherein the gate structures comprise a dummy gate structure and an active gate structure, and the dummy gate structure is disposed at a boundary of the active region.

8. The semiconductor device of claim 7, further comprising an insulating layer between the substrate and the gate structures, wherein a thickness of a first portion of the insulating layer between the substrate and the dummy gate structure is thicker than a thickness of a second portion of the insulating layer between the substrate and the active gate structure.

9. The semiconductor device of claim 1, further comprising a contact component disposed at the peripheral region of the substrate, wherein the contact component has a dielectric film on the substrate, a poly silicon portion on the dielectric film, and a conductive portion on the poly silicon portion.

10. The semiconductor device of claim 9, wherein a cross-section of the poly silicon portion of the fuse component is different from a cross-section of the poly silicon portion of the contact component.

* * * * *